United States Patent
Meyer et al.

(10) Patent No.: US 9,312,679 B2
(45) Date of Patent: Apr. 12, 2016

(54) OVERVOLTAGE PROTECTION DEVICE WITH A MEASURING DEVICE FOR MONITORING OVERVOLTAGE PROTECTION ELEMENTS

(75) Inventors: Thomas Meyer, Ottenstein (DE); Steffen Pfortner, Springe (DE); Andrei Siegel, Paderborn (DE); Friedrich-Eckhard Brand, Barntrup (DE)

(73) Assignee: PHOENIX CONTACT GMBH & CO. KG, Blomberg (DE)

( * ) Notice: Subject to any disclaimer, the term of this patent is extended or adjusted under 35 U.S.C. 154(b) by 62 days.

(21) Appl. No.: 14/238,680

(22) PCT Filed: Aug. 10, 2012

(86) PCT No.: PCT/EP2012/065690
§ 371 (c)(1),
(2), (4) Date: Feb. 12, 2014

(87) PCT Pub. No.: WO2013/024029
PCT Pub. Date: Feb. 21, 2013

(65) Prior Publication Data
US 2014/0218201 A1    Aug. 7, 2014

(30) Foreign Application Priority Data

Aug. 12, 2011  (DE) .......................... 10 2011 052 689
Mar. 8, 2012   (DE) ...................... 20 2012 002 281 U

(51) Int. Cl.
*G08B 21/00*    (2006.01)
*H02H 3/20*     (2006.01)
(Continued)

(52) U.S. Cl.
CPC ........... *H02H 3/20* (2013.01); *G01R 19/16576* (2013.01); *G01R 31/025* (2013.01); *H01T 1/12* (2013.01); *H01T 1/14* (2013.01); *H02H 9/042* (2013.01)

(58) Field of Classification Search
CPC ......... H02H 9/042; H02H 3/048; H02H 3/06; H02H 3/20; H02H 3/302; B60R 16/0315; G01R 19/0092; G01R 19/16576; G01R 1/07; G01R 1/203; G01R 1/206; G01R 1/36; G01R 31/025; G01R 1/3203; G06K 19/0716
USPC ......... 340/650, 662, 649, 651–655, 659–661, 340/663, 664, 691.6, 2.29, 3.43, 3.44
See application file for complete search history.

(56) References Cited

U.S. PATENT DOCUMENTS 4,672,501 A * 6/1987 Bilac et al. ...................... 361/96
5,388,023 A * 2/1995 Boy et al. ...................... 361/129
(Continued)

FOREIGN PATENT DOCUMENTS

DE    69511397      2/2000
DE    202004006227  10/2004
(Continued)

OTHER PUBLICATIONS

International Search Report issued in PCT/EP2012/065690 issued on Mar. 15, 2013.
(Continued)

*Primary Examiner* — Daniel Previl
(74) *Attorney, Agent, or Firm* — Knobbe Martens Olson & Bear LLP

(57) ABSTRACT

Systems and methods for overvoltage protection are disclosed. According to one illustrative implementation, an overvoltage protection device is provided having one or more overvoltage protection elements and a measuring device for monitoring the overvoltage protection elements. Further, the measuring device may include an evaluation device, which is designed to count pulse-like overvoltage events which are arrested by the overvoltage protection element, wherein the evaluation device is connected to the overvoltage protection element via a light-measuring device and/or a device for identifying a current flow. In further implementations, overvoltage protection devices may comprise an evaluation device which, on the basis of the counted pulses and/or an identified current flow, may determine whether the overvoltage protection element is still operational, is previously damaged, or is unusable, and/or an alarm device, which indicates whether the overvoltage protection element is still operational, is previously damaged, or is unusable.

21 Claims, 3 Drawing Sheets

(51) Int. Cl.
*H01T 1/12* (2006.01)
*H01T 1/14* (2006.01)
*H02H 9/04* (2006.01)
*G01R 19/165* (2006.01)
*G01R 31/02* (2006.01)

(56) References Cited

U.S. PATENT DOCUMENTS

| | | | | |
|---|---|---|---|---|
| 5,805,070 | A | * | 9/1998 | Eriksson ...................... 340/662 |
| 5,808,849 | A | * | 9/1998 | Storbeck ...................... 361/119 |
| 5,930,096 | A | * | 7/1999 | Kim ............................. 358/1.15 |
| 6,600,425 | B1 | | 7/2003 | Parsadayan |
| 2004/0032336 | A1 | | 2/2004 | Parsadayan |
| 2005/0231872 | A1 | | 10/2005 | Schimanski |
| 2008/0258253 | A1 | * | 10/2008 | Fey et al. ...................... 257/500 |
| 2009/0237848 | A1 | | 9/2009 | Chang |
| 2010/0321844 | A1 | * | 12/2010 | Landwehr ...................... 361/86 |
| 2011/0267730 | A1 | * | 11/2011 | Brand et al. ................. 361/91.2 |

FOREIGN PATENT DOCUMENTS

| | | |
|---|---|---|
| DE | 102009004673 | 7/2010 |
| DE | 202009018086 | 3/2011 |
| EP | 0676845 A1 | 11/1995 |
| EP | 1022837 | 7/2000 |
| EP | 1737091 | 12/2006 |
| WO | WO2007/106896 A2 | 9/2007 |
| WO | WO 2010/079132 | 7/2010 |

OTHER PUBLICATIONS

Machine English Language Abstract and translation of DE 69511397 published Feb. 10, 2000.
Machine English Language Abstract and translation of DE 102009004673 published Jul. 15, 2010.
Machine English translation of DE 202009018086 published Mar. 17, 2011.
Machine English translation of DE 202004006227 published Oct. 21, 2004.
Machine English Language Abstract and translation of WO 2010/079132 published Jul. 15, 2010.
Machine English Language Abstract and translation of EP 1737091 published Dec. 27, 2006.
Office Action received in counterpart Singapore application No. 201400383-4, dated Aug. 4, 2014, 5 pgs.

* cited by examiner

OVERVOLTAGE PROTECTION DEVICE WITH A MEASURING DEVICE FOR MONITORING OVERVOLTAGE PROTECTION ELEMENTS

CROSS REFERENCE TO RELATED APPLICATIONS

This application is a U.S. National Stage Application of International Application No. PCT/EP2012/065690 filed Aug. 10, 2012, published as WO2013/024029A2, which claims priority from German Patent Application No. 102011052689.7 filed Aug. 12, 2011 and German Patent Application No. 202012002281.4 filed Mar. 8, 2012, which are incorporated herein by reference in entirety.

The invention relates to a measuring arrangement for monitoring one or more overvoltage protection elements.

Gas-filled overvoltage arresters (gas discharge tubes or GDTs) are used in a large number of electrical devices for protection thereof against overvoltages, in particular pulse-like overvoltages. Here, the gas-filled overvoltage arrester has a hollow space, which is filled with a gas. Electrodes are inserted into the hollow space and/or are arranged at the edge of the hollow space and are to be connected to the voltage, which is to be supplied or measured, of the electrical device to be protected. Provided there is no voltage or only a low voltage applied between the electrodes, the gas-filled overvoltage arrester has a high resistance between the electrodes. Upon reaching a specific voltage, that is to say the ignition voltage, the gag-filled overvoltage arrester switches to a low resistance. As a result, the voltage between the two potentials of an electrical device to be protected falls. In the low-resistance state of the gas-filled overvoltage arrester, an arc is formed in the hollow space of the gas-filled overvoltage arrester. Since a comparatively high current flows, heat is produced.

Here, a large number of arrester events cause damage to the electrodes. Furthermore, arrester events may also occur however in which an arc ignited once burns over a long time and therefore may also lead to irreversible damage of the arrester and may make the arrester unusable.

A renewed switching of the gas-filled overvoltage arrester to a high-resistive state, that is to say the extinguishing of the arc, is difficult depending on the applied voltage.

With AC voltages, a change to the high-resistive state is generally possible without great effort, since the AC voltage has repeated zero crossings. With DC voltages however, this operation is much more difficult since an arc that is already burning also continues to burn below the ignition voltage. Only if a specific electrical power is undershot is the arc extinguished.

In order to still achieve a change to a high-resistive state in this case, shorting bars have been developed. Here, the shorting bar is triggered once a specific temperature has been reached and the electrodes of the gas-filled overvoltage arrester are short-circuited. The short circuit causes the current to then flow via the short circuit, and power then fails to continue to be fed to the arc in the gas-filled overvoltage arrester. As a result, the arc extinguishes and the gas-filled overvoltage arrester reverts to its high-resistive state.

In principle, it would be possible to identify this short circuit by direct measurement of the ohmic resistance. However, this is not always possible since corresponding technical apparatuses are to be provided for this purpose which are comparatively costly since they are to be designed in a manner protected against short circuit current. A design protected against short circuit necessarily leads to a large volume of the protective apparatus however. In addition, such an arrangement also negatively influences the measurement/the signal when installed in a measuring path/signal path.

Alternatively, it would be possible to measure a short circuit retrospectively by means or external wiring; this retrospective measurement is generally much too time-intensive however since it requires direct access, and, insofar as a galvanic isolation from the signal to be protected or from the supply voltage is necessary for safety reasons, this galvanic isolation has to be provided by separation from the electrical circuit.

Alternatively or additionally to gas-filled arresters, semiconductor components, for example TVS diodes, can also be used as overvoltage protection, in particular in the MSR field. With these components too, damage occurs as a result of a large number of overvoltage events or as a result of a prolonged overvoltage event.

It would therefore be desirable to obtain early on an indication of the state of damage such that a damaged overvoltage protection element can be replaced before its ultimate failure and such that the fault state can also be identified early on.

Previous systems, such as the system known from EP 1 737 091 A1, have provided an evaluation of the temperature for this purpose. The temperature measurement however, due to the indirect heating, is suitable only to a limited extent as a criterion for indicating the level of damage, since definitive damage can thus be detected at best.

The object of the invention therefore to provide an apparatus and a method which overcome one or more of the disadvantages known from the prior art.

The object is solved in accordance with the invention by the features in the independent claims. Advantageous embodiments of the invention are specified in the dependent claims.

The invention will be explained in greater detail hereinafter on the basis of preferred embodiments with reference to the accompanying drawings.

In the drawings

FIGS. 1 and 2 show a measuring arrangement 1. Here, FIG. 1 shows the case in which an arc LB occurs, whereas FIG. 2 shows the case in which the short-circuit spring F has been triggered subsequently to an arc LB and a short circuit has thus been produced via the shorting bar SC.

Figure 1:
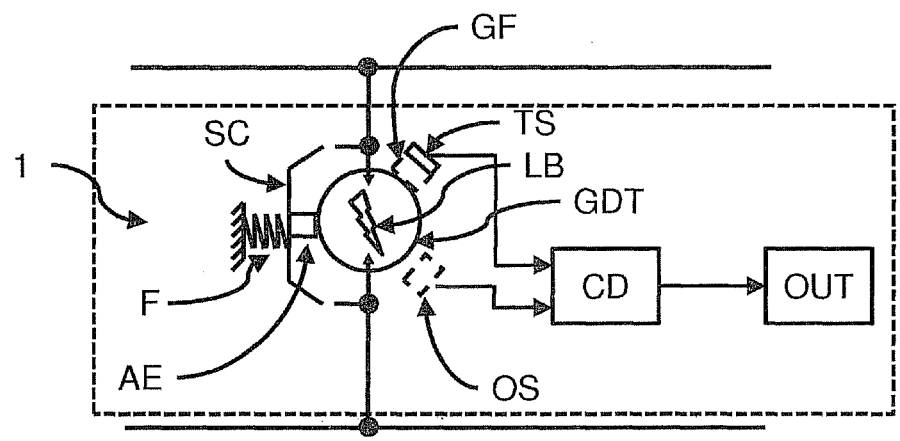
FIG. 1 shows a measuring arrangement according to a preferred embodiment of the invention in a first state.

The measuring arrangement 1 is arranged between two signal lines SL1 and SL2 and is indicated by way of example by a dashed rectangle. The measuring arrangement 1 indirectly monitors the switching state of a short-circuit spring F, wherein the short circuit spring F can actuate a shorting bar SC of a gas-filled overvoltage arrester GDT. To this end, a force is applied to the shorting bar SC by means of the short-circuit spring F, however the shorting bar is kept at a distance by means of a triggering arrangement AE, for example a soldering point comprising a solder having a low melting point. If the temperature at the gas-filled overvoltage arrester GDT rises, the triggering means AE thus melts at a specific temperature and the force of the short-circuit spring F is released and leads to a short circuit via the shorting bar SC now actuated. Furthermore, the measuring arrangement has a temperature measuring arrangement TS, which is in thermal contact with the gas-filled overvoltage arrester GDT, which can be short-circuited. Here, the thermal contact can be produced directly or indirectly. Direct contact can be provided by the mounting of the temperature measuring arrangement TS directly on the gas-filled overvoltage arrester GDT. Indirect contact is achieved with a distanced mounting, that is to say for example with an air gap, or with the introduction of a gap filler GF. Gap fillers are materials that are good conductors of heat, but are not electrically conductive.

Furthermore, the measuring arrangement 1 has an evaluating arrangement CD. The evaluating arrangement CD detects respective temperature values by means of the temperature measuring arrangement TS at different moments in time t1 and t2 and/or at further moments in time. This detection can take place periodically or may also be event-controlled. Here, the temperature value T1, which has been measured as a moment in time t1, may indicate the ambient temperature for example. If the temperature then rises sharply within a specific interval, the response of the gas-filled overvoltage arrester GDT can thus be read therefrom. If the temperature then falls, it is possible to conclude that the short-circuit spring F has been triggered. If it is identified by the evaluating arrangement CD that the short-circuit spring F has been triggered, an alarm arrangement OUT1 can thus be prompted to output a corresponding alarm. An alarm may have different forms here.

In an advantageous development of the invention, the state of the short-circuit spring F may additionally also be monitored optically by means of a light-measuring arrangement OS. Here, the evaluating arrangement CD detects respective optical measured values L1, L2 at different moments in time t3 and t4 and/or at further moments in time. Here, it should be noted that t3 or t4 (optical measurement) may also coincide, for example, with t1 and t2 respectively (thermal measurement). This detection may again take place periodically or may also be event-controlled. Here, the optical measured value L1, which has been measured at a moment in time t3, can specify the ambient brightness for example. If the brightness then rises sharply within a specific interval, the response of the gas-filled overvoltage arrester GDT can thus be read therefrom, since an arc LB has then formed. If the brightness falls again after a specific period of time (arc duration), it is possible to conclude that the short-circuit spring F has been triggered. If the evaluating arrangement CD identifies that the short-circuit spring F has been triggered, an alarm arrangement OUT1 can thus be prompted to output a corresponding alarm. An alarm may have different forms here.

As already suggested, optical measured values or temperature measured values may be detected in an event-controlled manner. If, for example, a rise in brightness is determined at the light-measuring arrangement OS, this can be used to trigger a temperature measurement. On the other hand, it is of course also possible to determine a temperature rise at the temperature-measuring arrangement TS and to use this to trigger a brightness measurement.

In an advantageous development, the measuring arrangement has two measuring methods and evaluates of measuring methods (optically, temperature) independently of one another. If it is determined as a result of both assessments that the short-circuit spring F has been triggered, the alarm can thus be prompted. Should only one of the measuring methods indicate a triggering of the short-circuit spring, an alarm can be provided in a different form. For example, a different optical signal can be used and/or a different acoustic signal can be produced, and/or a different electrical remote alarm signal can be produced.

In an advantageous development, the temperature-measuring arrangement TS is constructed with a thermally variable resistor. Here, the thermally variable resistor may be a thermistor, for example a PTC or an NTC. Alternatively, a pyrosensor may of course also be provided as a temperature-measuring arrangement TS. Without going into greater detail, different temperature sensors may also be provided, wherein the evaluating arrangement CD is then again able to assess the results of the respective temperature sensors.

The described invention is particularly suitable for use in an MSR application or in telecommunications applications since small designs are provided here.

Figure 3:
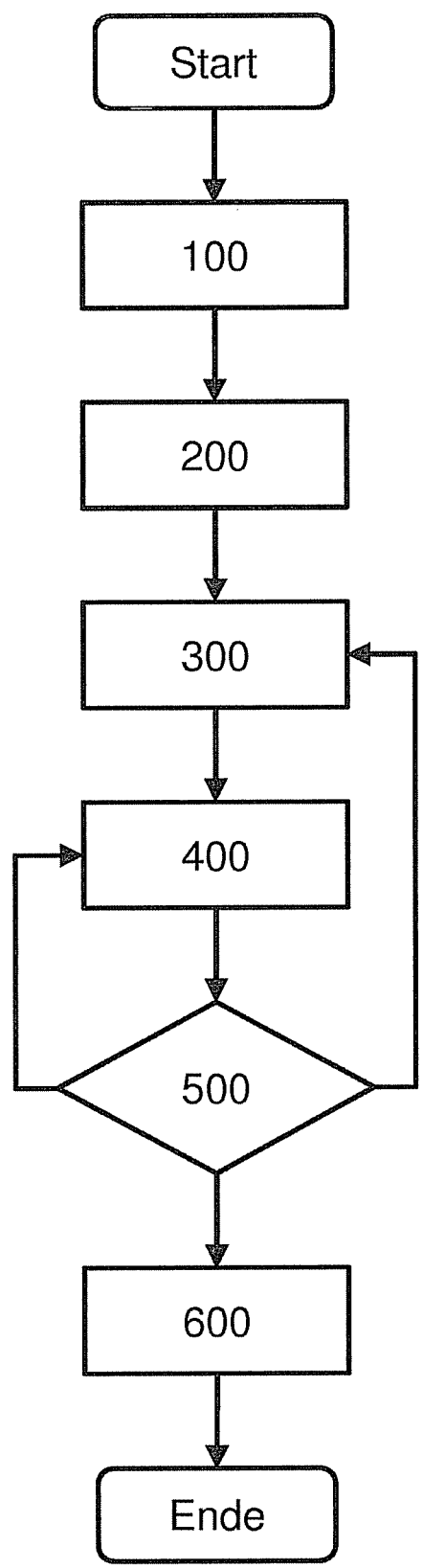
FIG. 3 shows a simplified flow diagram according to a preferred embodiment of the invention.

In a further embodiment the invention, a method for operating a measuring arrangement 1 is provided. This method is illustrated in a highly generalised manner in FIG. 3. Here, in a first step 100, a first temperature value T1 is measured at a first moment in time t1 by means of a temperature-measuring arrangement TS, which is in thermal contact with a gas-filled overvoltage arrester GDT, which can be short-circuited. This temperature value is an ambient temperature value for example. In an optional step 200, a first optical measured value L1 can be measured at the same moment in time or at a further moment in time, generally a third moment in time t3, by means of a light-measuring arrangement OS, which optically monitors the state of the gas-filled overvoltage arrester GDT, which can be short-circuited, and in particular the triggering of the short-circuit spring F. In a further step 300, a second temperature value T2 is measured by means of the temperature-measuring arrangement TS at a second moment in time t2. Here, the second moment in time t2 is different from the first moment in time t1. In an optional step 4100, a second optical measured value L2 can be measured at the same moment in time t2 or at a further moment in time, generally a fourth moment in time t4. Here, the fourth moment in time t4 is at least different form the third moment in time t3. In a further step 500 it is identified on the basis of the measured first temperature value T1 and on the basis of the second temperature value T2, and, if provided, it is further identified optionally or additionally on the basic of the measured first optical measured value L1 and on the basis of the second optical measured value L2 whether the short-circuit spring F has been triggered. If no trigger is identified, the method for example reverts to step 300. A periodic interrogation can thus be implemented. Alternatively, an identification of a temperature rise may also lead to an event-controlled interrogation of a second optical measured value, that is to say the method jumps to step 400, or in the case of identification of a rise in brightness, leads to an event-controlled interrogation of a second temperature value, that is to say the method jumps to step 300. If, in step 500, it is identified that the short-circuit spring F has been triggered, this identification is indicated in a step 600. The alarm may be formed differently here and for example may contain a statement as to whether one or more measuring methods (when different measuring methods are provided) indicate a triggering of the short-circuit spring. Here, a corresponding optical and/or acoustic and/or electrical signal may be output if the triggering of the short-circuit spring F is identified.

A further method is described hereinafter which can be used alternatively or additionally to the method described previously. Here, the method is focused on the operation of an overvoltage protection device. The overvoltage protection device has a measuring arrangement 1 for monitoring one or more overvoltage protection elements TVS, GDT and an evaluating arrangement CD. The evaluating arrangement CD is connected via a light-measuring arrangement OS1, OS2 to the respective overvoltage protection element TVS, GDT. Furthermore, the overvoltage protection device has an arrangement for identifying a current which is flowing for a long period of time and which flows through the overvoltage protection element (TVS, GDT).

The evaluating arrangement then counts the pulses and additionally identifies whether a current flowing for a long period of time is flowing. It is determined from the number of counted pulses and/or an identified current flowing for a long period of time whether the respective monitored overvoltage protection element TVS, GDT is still operational, has sustained previous damage or is unusable. Based on the result of the determination, it is indicated whether the overvoltage protection element (TVS, GDT) is still operational, has sustained previous damage or is unusable.

In the case of the invention, the triggering of the shorting bar is monitored indirectly. Here, the triggering of the spring is identified, and, if desired, is forwarded on. To this end, the temperature at the gas-filled overvoltage arrester GDT or in the vicinity thereof is measured. By evaluating successive temperature values T1, T2, which have been measured at different times t1, t2, it is possible to establish the temperature profile and from this the state of the gas-filled overvoltage arrester GDT or the state of the shorting bar SC or the state of the spring F. Here, the ambient temperature can also be determined as a variable since either a first value alone or an averaging of a series of past values provides an indication of the ambient temperature. The same is true for the ambient brightness. Here, the ambient brightness can also be determined as a variable since either a first value alone or an averaging of a series of past values provides an indication of the ambient brightness.

Since the arrangement of the temperature-measuring arrangement and also the optical measuring arrangement provide a galvanic isolation, the otherwise usual requirements of protection against short-circuit current do not have to be met, as would be necessary in the case of a galvanically unisolated, direct measurement.

Furthermore, since the monitoring process then takes place outside the signal lines SL1, SL2, the monitoring process does not influence the signal over the signal lines.

In addition, the galvanically isolated arrangement also allows a very compact design, since the component parts are now no longer to be designed in a manner protected against short circuit.

In order to improve the response behaviour of the temperature-measuring arrangement TS, the temperature-measuring arrangement TS can be in thermal contact with the gas-filled overvoltage arrester GDT by means of a gap filler GF. Such gap fillers are not electrically conductive, but are still good conductors of heat. Such gap fillers are based on silicone or on polyimide, for example. Since a good thermal conductor compared to air is then provided, a temperature change will be detected considerably more quickly by the temperature-measuring arrangement TS.

Other events, such as the flashing of an arc, may additionally be incorporated in the evaluation.

Figure 4:
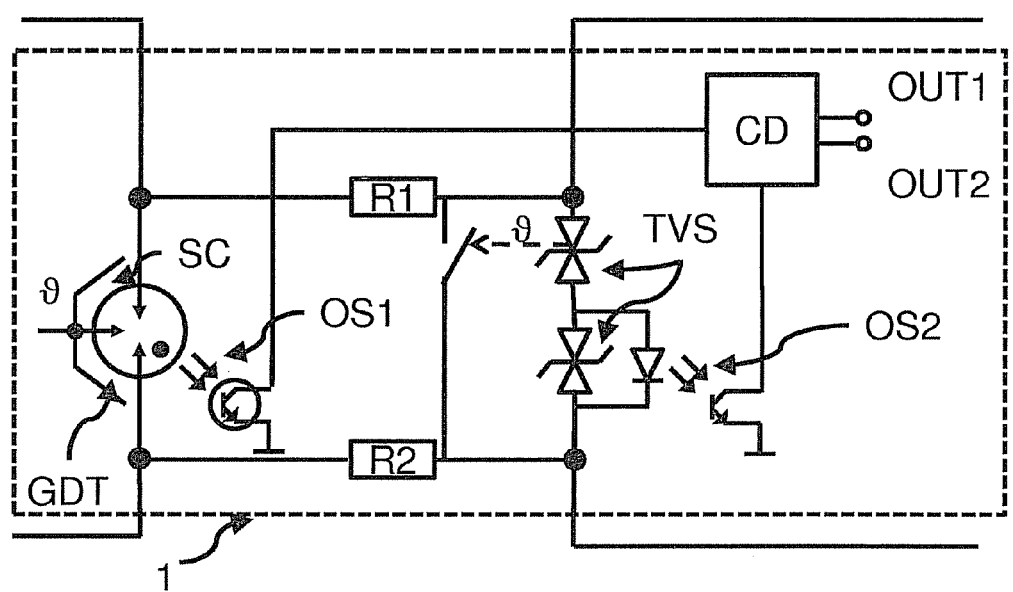
FIG. 4 shows a measuring arrangement according to a further preferred embodiment of the invention.

A further embodiment of the invention is illustrated in FIG. 4. Here, an overvoltage protection device has a measuring arrangement for monitoring one or more overvoltage protection elements TVS and/or GDT.

For example, the overvoltage protection device has a gas-filled overvoltage arrester GDT and/or a semiconductor element, in particular a protective diode, in particular a TVS diode, as an overvoltage protection element.

To this end, the overvoltage protection device has an evaluating arrangement CD, which is designed to count pulse-like overvoltage events which are arrested by the respective overvoltage protection element TVS and/or GDT.

The evaluating arrangement CD is advantageously connected for this purpose via a light-measuring arrangement OS1, for example a phototransistor, to the overvoltage protection element GDT or is connected directly to the overvoltage protection element TVS via a light-measuring arrangement OS2, for example an optocoupler. In this case, some of the discharge current flows via the optocoupler on one side.

Furthermore, the overvoltage protection device has an arrangement for identifying a current which is flowing for a long period of time and which flows through the overvoltage protection element TVS, GDT.

The arrangement for identifying a current flowing for a long period of time is advantageously optically adapted, for example for a gas-filled arrester, and optically establishes a current flowing for a long period of time indirectly on the basis of the arc duration of a gas-filled arrester, or via a leakage current which flows through a protective diode.

Furthermore, the overvoltage protection device has an evaluating arrangement CD, which, based on the counted pulses and/or an identified current flowing for a long period of time, determines whether the overvoltage protection element TVS, GDT is still operational, has sustained previous damage, or is unusable.

In addition, the overvoltage protection device has one or more alarm arrangements OUT1, OUT2, which indicate whether the overvoltage protection element TVS, GDT is still operational, has sustained previous damage, or is unusable.

The alarm arrangement OUT1 may provide a first status display, which indicates a previously damaged state, for example a warning state, for example yellow.

The alarm arrangement OUT2 may provide a second status display, which indicates an unusable state, for example a fault state, for example red. Here, it can generally be assumed that if one of the component parts is identified as faulty or is assumed to be faulty, the fault alarm is to be implemented in the manner of an "or" link.

In the schematic illustration of FIG. 4, two exemplary resistors R1, R2 are also indicated. In the figure, a working arrangement is also provided at the protective diodes and can be thermally activated and can lead to an interruption of the flow of current or to a short circuit past the protective diodes, similarly to the shorting bar SC.

Without going into greater detail, the state can be provided on the basis of a complex assessment. For example, the arc duration, which leads to a fault state, may thus decrease depending on the number of previously arrested pulses. In other words, if many pulses have already been arrested, even a short arc duration is sufficient to reach the fault state. Conversely, the arc duration may also result in the fact that even a lower number of pulses leads to a damage display or fault display.

As a result of the invention, it is thus made possible to obtain an accurate indication of the state of damage or a fault state via a direct detection in particular of the arrester events.

Figure 2:
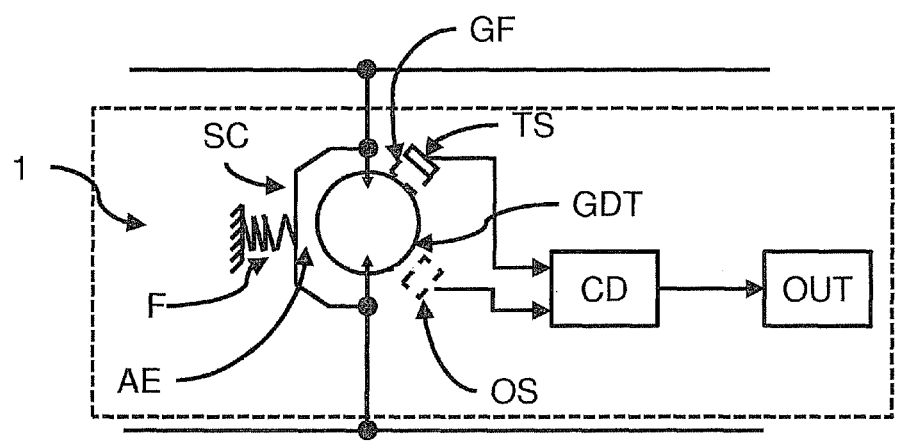
FIG. 2 shows the measuring arrangement according to a preferred embodiment of the invention in a second state.

Furthermore, the embodiment in FIGS. 1 and 2 and 4 can be implemented in a common arrangement.

The invention described above can be used in particular in the MSR field and in the telecommunications field since it does not require high nominal currents.

| List of reference signs | |
| --- | --- |
| measuring arrangement | 1 |
| short-circuit spring | F |
| shorting bar | SC |
| gas-filled overvoltage arrester | |

List of reference signs

| | |
|---|---|
| GDT | |
| temperature-measuring arrangement | TS |
| light-measuring arrangement | OS |
| evaluating arrangement | CD |
| trigger arrangement | AE |
| alarm arrangement | OUT1, OUT2, OUT |
| gap filler | GF |
| arc | LB |
| signal line | SL1, SL2 |
| resistor | R1, R2 |

The invention claimed is:

1. An overvoltage protection device comprising:
one or more overvoltage protection elements, including a gas-filled overvoltage arrester, which can be short-circuited, as an overvoltage protection element; and
a measuring arrangement for monitoring the overvoltage protection elements, wherein the measuring arrangement comprises:
a temperature-measuring arrangement, which is in thermal contact with the gas-filled overvoltage arrester, which can be short-circuited;
an evaluating arrangement, which identifies whether the short-circuit spring has been triggered on the basis of a measured first temperature value and a second temperature value, which are measured by the measuring arrangement at a first moment in time and a second moment in time, which is different from the first moment in time, respectively; and
an alarm arrangement, which provides indication as to whether the short-circuit spring has been triggered, wherein the evaluating arrangement is adapted to generate the indication;
wherein the measuring arrangement is adapted for indirectly monitoring triggering of a short circuit spring of the gas-filled overvoltage arrester.

2. The overvoltage protection device according to claim 1, wherein the overvoltage protection device has a semiconductor component, as an overvoltage protection element.

3. The overvoltage protection device according to claim 2, wherein the semiconductor component includes a protective diode and/or a transient-voltage-suppression (TVS) diode.

4. The overvoltage protection device according to claim 2 wherein the alarm arrangement has a first status display, which indicates a previously damaged state, and a second status display, which indicates an unusable state.

5. The overvoltage protection device according to claim 2 wherein the measuring arrangement is also coupled for the indirect monitoring of a short-circuit spring of a gas-filled overvoltage arrester, and
wherein the overvoltage protection device further comprises:
a temperature-measuring arrangement, which is in thermal contact with the gas-filled overvoltage arrester, which can be short-circuited,
an evaluating arrangement, which, based on temperature values that have been measured at different times, identifies whether the short-circuit spring has been triggered,
an alarm arrangement, which indicates the identification of a triggered short-circuit spring, wherein the alarm is implemented by the evaluating arrangement.

6. The overvoltage protection device according to claim 1, wherein the alarm arrangement has a first status display, which indicates a previously damaged state, and a second status display, which indicates an unusable state.

7. The overvoltage protection device according to claim 1, wherein the measuring arrangement is also coupled for the indirect monitoring of a short-circuit spring of the gas-filled overvoltage arrester, and
wherein the overvoltage protection device further comprises:
a temperature-measuring arrangement, which is in thermal contact with the gas-filled overvoltage arrester, which can be short-circuited,
an evaluating arrangement, which, based on temperature values that have been measured at different times, identifies whether the short-circuit spring has been triggered, and
an alarm arrangement, which indicates the identification of a triggered short-circuit spring, wherein the alarm is implemented by the evaluating arrangement.

8. The overvoltage protection device according to claim 7, wherein the light measuring arrangement is further designed to optically monitor the gas-filled overvoltage arrester, which can be short-circuited, on the basis of the state of the short-circuit spring, and
wherein the evaluating arrangement furthermore identifies, also based on optical measured values which have been measured as different times, whether the short-circuit spring has been triggered.

9. The overvoltage protection device according to claim 8, wherein the temperature sensor is in thermal contact via a gap filler with the gas-filled overvoltage arrester.

10. The overvoltage protection device according to claim 7, wherein the temperature sensor is in thermal contact via a gap filler with the gas-filled overvoltage arrester, which can be short-circuited.

11. The overvoltage protection device according to claim 7, wherein the temperature-measuring arrangement has a thermally variable resistor.

12. The overvoltage protection device according to claim 11, wherein the thermally variable resistor is a positive thermal coefficient (PTC) resistor or a negative temperature coefficient (NTC) resistor.

13. The overvoltage protection device according to claim 7, wherein the temperature-measuring arrangement has a pyrosensor.

14. The overvoltage protection device according to claim 7, wherein the measuring arrangement is arranged and configured for use in a n MSR measure and control application or in telecommunications applications.

15. The overvoltage protection device according to claim 7, wherein the alarm arrangement outputs an optical and/or acoustic and/or an electrical signal when the triggering of the short-circuit spring is identified.

16. A method for operating a measuring arrangement for indirect monitoring of triggering of a short-circuit spring of a gas-filled overvoltage arrester, which can be short-circuited, with a temperature-measuring arrangement, which is in thermal contact with the gas-filled overvoltage arrester, which can be short-circuited, said method comprising the following steps:
measuring a first temperature value at a first moment in time,
measuring a second temperature value at a second moment in time, which is different from the first moment in time,
identifying, on the basis of the measured first temperature value and on the basis of the measured second temperature value, whether the short-circuit spring has been triggered, and upon identifying that the short-circuit spring has been triggered, indicating the identification.

17. The method according to claim 16, wherein the measuring arrangement further has a light-measuring arrangement, which optically monitors the state of the gas-filled overvoltage arrester, which can be short-circuited, and in particular the triggering of the short-circuit spring, said method further comprising the following steps:
measuring a first optical measured value at a third moment in time,
measuring a second optical measured value at a fourth moment in time, which is different from the third moment in time, and
identifying, on the basis of the measured first optical measured value and on the basis of the measured second optical measured value, whether the short-circuit spring has been triggered.

18. The method according to claim 17, wherein the measuring arrangement further has an alarm arrangement, said method further comprising:
outputting one or more of an optical signal, an acoustic signal and an electrical signal when the triggering of the short-circuit spring has been identified.

19. The method according to claim 16, wherein the measuring arrangement further has an alarm arrangement, said method further comprising the following step:
outputting one or more of an optical signal, an acoustic signal and an electrical signal when the triggering of the short-circuit spring has been identified.

20. An overvoltage protection device with one or more overvoltage protection elements and a measuring arrangement for monitoring the overvoltage protection elements, the overvoltage protection device comprising:
an evaluating arrangement, which is designed to count pulse-like overvoltage events which are arrested by the overvoltage protection element, wherein the evaluating arrangement is connected via a light-measuring arrangement to the overvoltage protection element, and/or
an arrangement for identifying a current which is flowing for a long period time and which is flowing through the overvoltage protection element;
wherein the overvoltage protection device additionally comprises:
an evaluating arrangement, which, based on the counted pulses and/or an identified current which is flowing for a long period of time, determines whether the overvoltage protection element is still operational, has sustained previous damage or is unusable and
a first alarm arrangement, which indicates whether the overvoltage protection element is still operational, has sustained previous damage or is unusable;
wherein the measuring arrangement is also coupled for the indirect monitoring of a short-circuit spring of a gas-filled overvoltage arrester, and
wherein the overvoltage protection device further comprises:
a temperature-measuring arrangement, which is in thermal contact with the gas-filled overvoltage arrester, which can be short-circuited,
an evaluating arrangement, which, based on temperature values that have been measured at different times, identifies whether the short-circuit spring has been triggered, and
a second alarm arrangement, which indicates the identification of a triggered short-circuit spring, wherein the alarm is implemented by the evaluating arrangement.

21. An overvoltage protection device comprising:
one or more overvoltage protection elements, wherein at least one of the one or more overvoltage protection elements includes a gas-filled overvoltage arrester;
a measuring arrangement for monitoring the one or more overvoltage protection elements, wherein the measuring arrangement is also coupled for indirect monitoring of a short-circuit spring of a gas-filled overvoltage arrester;
a first evaluating arrangement, which, based on the counted pulses and/or an identified current which is flowing for a long period of time, determines whether the overvoltage protection element is still operational, has sustained previous damage or is unusable, and
a first alarm arrangement, which indicates whether the overvoltage protection element is still operational, has sustained previous damage or is unusable;
a temperature-measuring arrangement, which is in thermal contact with the gas-filled overvoltage arrester, which can be short-circuited,
a second evaluating arrangement, which, based on temperature values that have been measured at different times, identifies whether the short-circuit spring has been triggered;
a second alarm arrangement, which indicates the identification of a triggered short-circuit spring, wherein the alarm is implemented by the evaluating arrangement;
wherein the overvoltage protection device further comprises:
a second evaluating arrangement, which is designed to count pulse-like overvoltage events which are arrested by the overvoltage protection element, wherein the evaluating arrangement is connected via a light-measuring arrangement to the overvoltage protection element, and/or
an identifying arrangement for identifying a current which is flowing for a long period time and which is flowing through the overvoltage protection element.

* * * * *